United States Patent
Bae et al.

(10) Patent No.: US 7,608,988 B2
(45) Date of Patent: Oct. 27, 2009

(54) CYLINDRICAL PIEZOELECTRIC UNIT AND PRINTER HEAD HAVING THE SAME

(75) Inventors: Jong-Sung Bae, Cheonan-si (KR); Min-Young Won, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 516 days.

(21) Appl. No.: 11/373,714

(22) Filed: Mar. 10, 2006

(65) Prior Publication Data

US 2006/0244347 A1 Nov. 2, 2006

(30) Foreign Application Priority Data

Apr. 28, 2005 (KR) ............ 10-2005-0035558

(51) Int. Cl.
  *B41J 2/045* (2006.01)
(52) U.S. Cl. .................... 310/369; 347/72
(58) Field of Classification Search ......... 310/363–366, 310/311, 328; 347/68–72
  See application file for complete search history.

(56) References Cited

U.S. PATENT DOCUMENTS

| | | | | |
|---|---|---|---|---|
| 3,109,112 | A * | 10/1963 | Lester | 310/322 |
| 4,158,847 | A * | 6/1979 | Heinzl et al. | 347/40 |
| 4,272,200 | A * | 6/1981 | Hehl | 400/124.16 |
| 4,284,996 | A * | 8/1981 | Greve | 347/11 |
| 4,376,284 | A * | 3/1983 | Bader et al. | 347/40 |
| 4,412,232 | A * | 10/1983 | Weber et al. | 347/68 |
| 4,414,552 | A * | 11/1983 | Bergmann et al. | 347/68 |
| 4,415,909 | A * | 11/1983 | Italiano et al. | 347/68 |
| 4,455,560 | A * | 6/1984 | Louzil | 347/71 |
| 4,493,137 | A * | 1/1985 | Bader et al. | 29/25.35 |
| 4,961,176 | A * | 10/1990 | Tanaka et al. | 367/155 |
| 5,172,141 | A * | 12/1992 | Moriyama | 347/68 |
| 5,552,813 | A * | 9/1996 | Takada et al. | 347/40 |
| 5,825,386 | A * | 10/1998 | Ohashi | 347/71 |
| 6,310,427 | B1 * | 10/2001 | Culbert et al. | 310/337 |
| 6,416,172 | B2 * | 7/2002 | Jeong et al. | 347/72 |
| 7,258,428 | B2 * | 8/2007 | Reddy et al. | 347/68 |
| 7,490,405 | B2 * | 2/2009 | Sanada | 29/890.1 |
| 2002/0150511 | A1 * | 10/2002 | Wiktor | 422/100 |
| 2005/0212863 | A1 * | 9/2005 | Sanada | 347/68 |
| 2006/0066682 | A1 * | 3/2006 | Karrem Reddy et al. | 347/68 |
| 2006/0071580 | A1 * | 4/2006 | Sawada | 310/369 |
| 2006/0244347 | A1 * | 11/2006 | Bae et al. | 310/369 |
| 2007/0018540 | A1 * | 1/2007 | Seto | 310/369 |
| 2007/0262679 | A1 * | 11/2007 | Maruyama et al. | 310/369 |
| 2008/0158306 | A1 * | 7/2008 | Silverbrook | 347/71 |

* cited by examiner

*Primary Examiner*—Jaydi SanMartin
(74) *Attorney, Agent, or Firm*—Cantor Colburn LLP

(57) ABSTRACT

A piezoelectric unit includes a first piezoelectric member having a tubular shape, a second piezoelectric member inserted into a first opening of the first piezoelectric member, and a voltage applying member applying a driving voltage to the first and second piezoelectric members. An orifice plate includes a body through which first nozzle openings corresponding to the first piezoelectric member and second nozzle openings corresponding to the second piezoelectric member are formed. An elastic member is disposed between the first and second nozzle openings and the piezoelectric unit. A shape of the elastic member is changed in accordance with a changed shape of the piezoelectric unit for jetting ink through the first and second nozzle openings. Thus, a nozzle pitch of a printer head may be reduced.

21 Claims, 10 Drawing Sheets

CYLINDRICAL PIEZOELECTRIC UNIT AND PRINTER HEAD HAVING THE SAME

This application claims priority to Korean Patent Application No. 2005-35558, filed on Apr. 28, 2005 and all the benefits accruing therefrom under 35 U.S.C. §119, and the contents of which in its entirety are herein incorporated by reference.

BACKGROUND OF THE INVENTION

1. Field of the Invention

The present invention relates to a piezoelectric unit and a printer head having the piezoelectric unit. More particularly, the present invention relates to a piezoelectric unit having a tubular shape and a printer head capable of reducing a nozzle pitch.

2. Description of the Related Art

Generally, examples of an ink jet type head for a printer include a piezoelectric jet type head and a bubble jet type head. In the piezoelectric jet type head, a piezoelectric unit is employed as a pressure-generating member for jetting ink. In the bubble jet type head, ink is jetted by a gas pressure.

An ink jet head of the piezoelectric jet type includes a thin film vibrator type head and a bulk vibrator type head. In the thin film vibrator type head, a fine pattern or a thin film layer is employed as a head structure through a semiconductor thin film process. In the bulk vibrator type head, a ceramic piezoelectric material having a rod shape is employed as a piezoelectric member.

In the bubble jet type, ink is heated to generate bubbles, therefore ink having a low heat-resistance is not employed in the bubble jet type.

In the thin film vibrator type head such as a Xaar type head, a Spectra type head, a bend type head, etc., a vibrator is coated using a screen printing method, a deposition method, and so on, to be sintered and patterned. Thus, the thin film vibrator type head has a small nozzle pitch.

However, since a bulk vibrator type head has a higher reliability and larger sized drops than those of a thin film vibrator type head, the bulk vibrator type head is advantageous over the thin film vibrator type head when printing a substrate having a large surface area. For example, when forming an alignment film on a substrate of a liquid crystal display ("LCD") device in order to set up an alignment direction of liquid crystal molecules on the substrate of the LCD device, the bulk vibrator type head is usually used.

The bulk vibrator type head is manufactured by sequentially forming, sintering and cutting piezoelectric ceramics in a bulk shape. However, piezoelectric ceramics are brittle making the manufacture of piezoelectric ceramics having a thickness of no more than about 1 mm difficult. Thus, it is difficult to arrange nozzle openings corresponding to the bulk vibrator type head at a sufficiently narrow interval.

Therefore, when the bulk vibrator type head is employed in an alignment film printer of an ink jet type, ink drops jetted from the bulk vibrator type head have an insufficiently small pitch, so that an alignment film has a nonuniform thickness.

BRIEF SUMMARY OF THE INVENTION

The present invention obviates the above problems and thus the present invention provides a piezoelectric unit having a tubular shape and capable of densifying nozzles of the piezoelectric unit.

The present invention also provides a printer head having the above-mentioned piezoelectric unit and thus capable of reducing a nozzle pitch.

In exemplary embodiments of the present invention, a piezoelectric unit is for an ink jet printer head, wherein a shape of the piezoelectric unit is changed in accordance with a driving voltage applied to the piezoelectric unit. The piezoelectric unit includes a first piezoelectric member and a second piezoelectric member. The first piezoelectric member has a first opening formed in a first direction, and having a tubular shape. The second piezoelectric member is inserted into the first opening.

The second piezoelectric member may also have a tubular shape so as to be arranged concentrically within the first piezoelectric member.

An inner surface of a sidewall of the first piezoelectric member may contact an outer surface of a sidewall of the second piezoelectric member.

The second piezoelectric member optionally includes at least two sub piezoelectric members each having a tubular shape. A smaller one of the sub piezoelectric members is inserted into an opening of a larger one of the sub piezoelectric members. The opening of the larger one of the sub piezoelectric members is formed in the first direction.

The first piezoelectric member and the at least two sub piezoelectric members may share a same longitudinal axis.

The piezoelectric unit may include a voltage applying member electrically connected to the first and second piezoelectric members to apply the driving voltage to the first and second piezoelectric members. A first electrode of the voltage applying member applies the driving voltage to the first and second piezoelectric members and a second electrode of the voltage applying ember applies a common voltage to the first and second piezoelectric members. The common voltage may have a different polarity than a polarity of the driving voltage. The first electrode may be connected to a top face of each of the first and second piezoelectric members, and the second electrode may be connected to a bottom face of each of the first and second piezoelectric members.

In other exemplary embodiments of the present invention, a printer head includes a piezoelectric unit, an orifice plate, and an elastic member. The piezoelectric unit includes a first piezoelectric member, a second piezoelectric member, and a voltage applying member. The first piezoelectric member has a first opening formed in a first direction, so that the first piezoelectric member has a tubular shape. The second piezoelectric member is inserted into the first opening. The voltage applying member applies a driving voltage to the first and second piezoelectric members to change a shape of each of the first and second piezoelectric members. The orifice plate includes a body, and has a plurality of first nozzle openings, an ink receiving end of the plurality of first nozzle openings facing the first piezoelectric member, and a plurality of second nozzle openings, an ink receiving end of the plurality of first nozzle openings facing the second piezoelectric member. The first and second nozzle openings are formed through the body. The elastic member is disposed between the ink receiving ends of the first and second nozzle openings, and the first and second piezoelectric members. A shape of the elastic member is changed in accordance with a changed shape of each of the first and second piezoelectric members upon application of the driving voltage resulting in ink jetting through the first and second nozzle openings.

The first piezoelectric member, for example, includes a first bottom face having a ring shape and a first sidewall extended from the first bottom face. The second piezoelectric member, for example, includes a second bottom face having a substantially same center as a center of the first bottom face and a second sidewall extended from the second bottom face and inserted into the first opening.

The piezoelectric unit optionally further includes a third piezoelectric member having a third bottom face having a substantially same center as the center of the second bottom face and a third sidewall extended from the third bottom face, and inserted into a second opening defined by an inner surface of the second sidewall. The orifice plate may then have a plurality of third nozzle openings, an ink receiving end of each of the plurality of third nozzle openings facing the third piezoelectric member, the third nozzle openings formed through the body.

The orifice plate may have a first ink providing groove and a second ink providing groove, both formed on the surface of the body. The first ink providing groove has a ring shape and faces the first bottom face. The second ink providing groove has a ring shape and faces the second bottom face.

The first nozzle openings and the second nozzle openings may be disposed along a direction substantially perpendicular to a normal line with respect to the surface of the body, and spaced apart from each other at uniform intervals.

The orifice plate, for example, includes a first partition wall and a second partition wall. The first partition wall surrounds a peripheral portion of each of the first nozzle openings and is protruded from a first bottom portion of the first ink providing groove by a height less than a depth of the first ink providing groove. The second partition wall surrounds a peripheral portion of each of the second nozzle openings and is protruded from a second bottom portion of the second ink providing groove by a height less than a depth of the second ink providing groove.

The elastic member may include a plurality of flow grooves, each flow groove corresponding to a respective nozzle opening, wherein the ink flows into an area enclosed by the partition walls by passing over the partition walls.

The printer head optionally includes a plurality of the piezoelectric units. The first ink providing grooves of the piezoelectric units are arranged in a zigzag shape along a second direction that is different from the first direction.

According to the above, a plurality of nozzle openings corresponds to one piezoelectric unit. Thus, the nozzle openings have a reduced pitch, so that a layer of a printer head, which has a uniform thickness, may be formed.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1A:
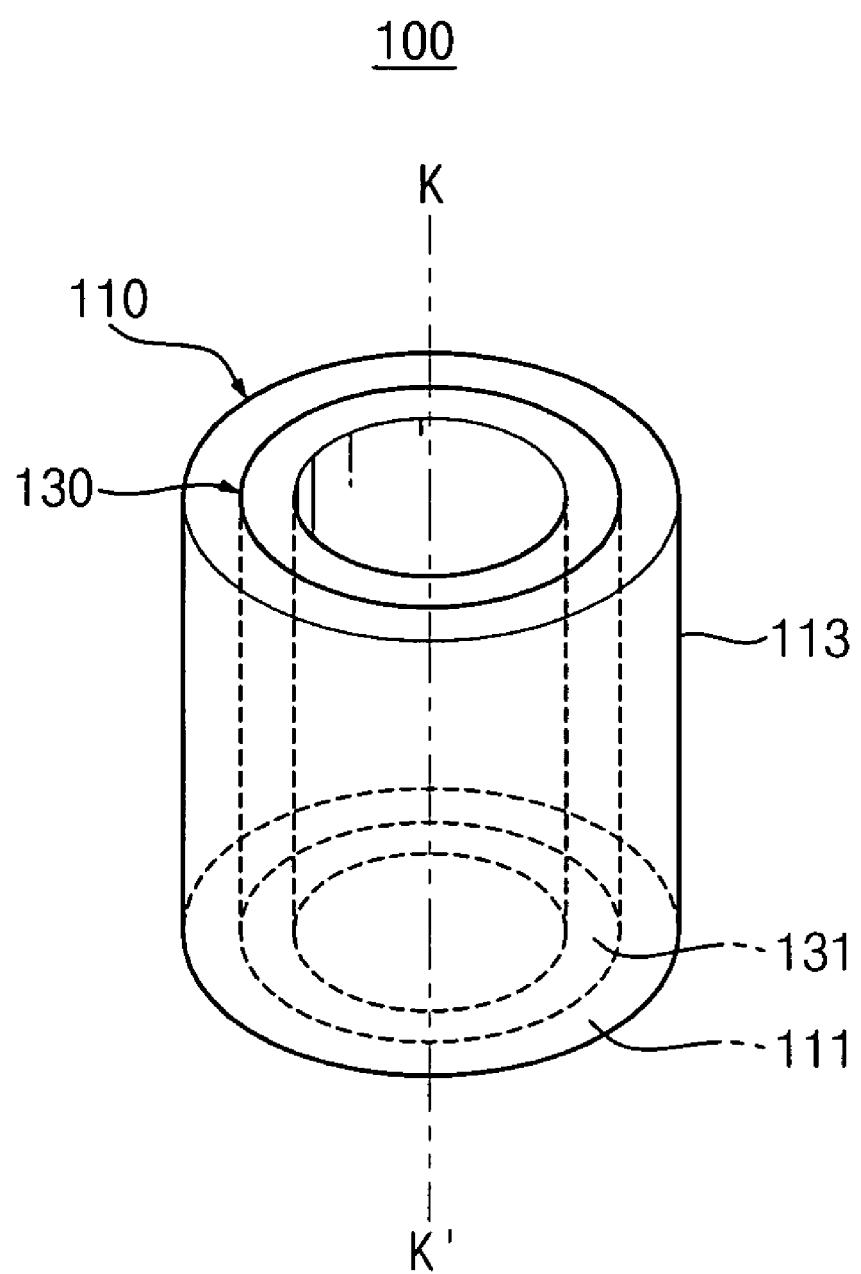
FIG. 1A is a perspective view illustrating an exemplary embodiment of a piezoelectric unit according to the present invention.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like reference numerals refer to similar or identical elements throughout.

Piezoelectric Unit

Figure 1B:
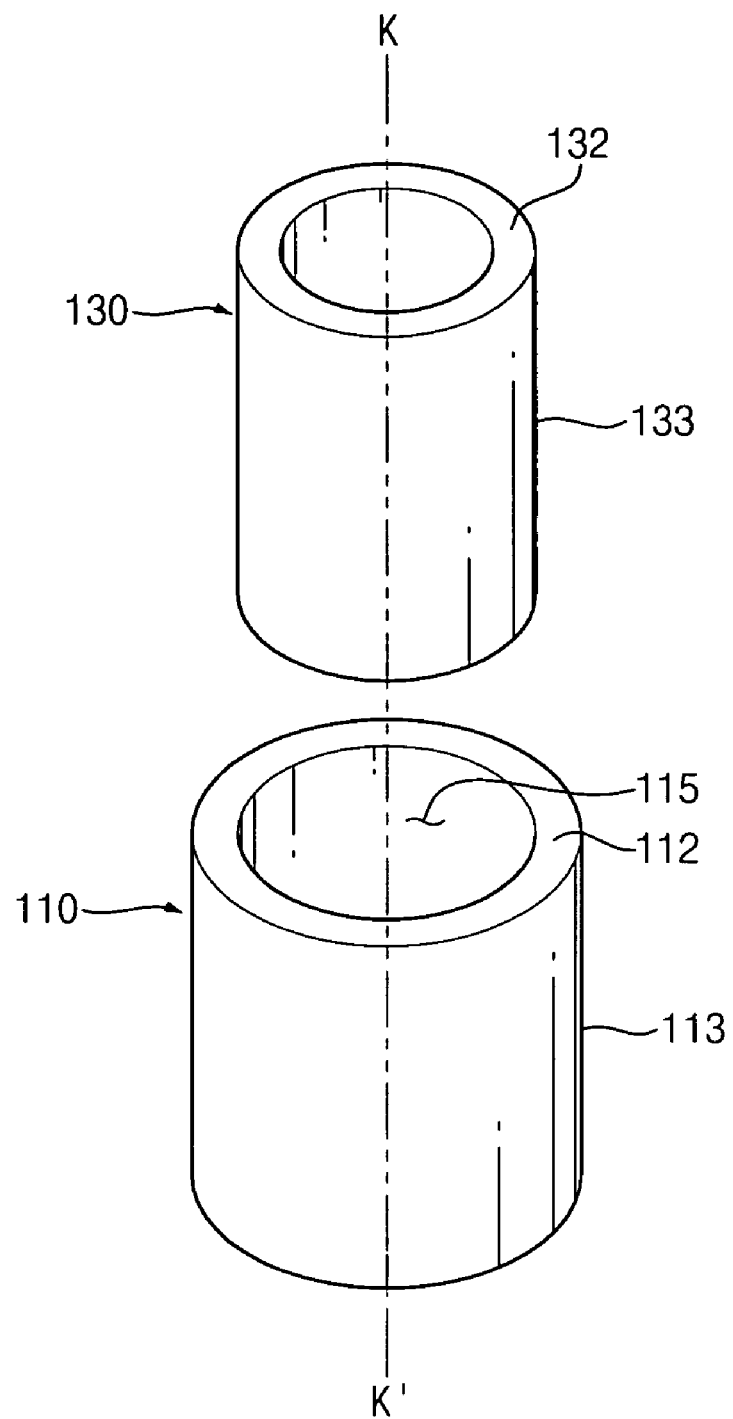
FIG. 1B is an exploded perspective view illustrating the exemplary piezoelectric unit in FIG. 1A.

FIG. 1A is a perspective view illustrating an exemplary embodiment of a piezoelectric unit according to the present invention. FIG. 1B is an exploded perspective view illustrating the exemplary piezoelectric unit in FIG. 1A.

Referring to FIGS. 1A and 1B, a piezoelectric unit 100 includes a first piezoelectric member 110 and a second piezoelectric member 130.

The first piezoelectric member 110 has a first opening 115 formed in a first direction k-k', so that the first piezoelectric member 110 has a tubular shape. A longitudinal axis of the first piezoelectric member 110 may extend along the first direction k-k'. The first piezoelectric member 110 includes a first bottom face 111 and a first sidewall 113. The first bottom face 111, for example, has a ring shape. In the illustrated embodiment, the ring shape of the first bottom face 111 has a circular shaped outer perimeter and a smaller circular shaped inner perimeter. Alternatively, the first bottom face 111 may have a polygonal shape. The first sidewall 113 is extended from the first bottom face 111 in a direction substantially perpendicular to the first bottom face 111, so that an inner surface of the first sidewall 113 defines the first opening 115 and an outer surface of the first sidewall 113 defines a portion of an outer surface of the piezoelectric unit 100. The first piezoelectric member 110 also includes a first top face 112 that may have the same shape as the first bottom face 111. The first top face 112 may be substantially parallel to the first bottom face 111, and the first sidewall 113 may extend from the first top face 112 in a direction substantially perpendicular to the first top face 112.

The second piezoelectric member 130 is inserted into the first opening 115. Thus, the second piezoelectric member 130 is nested within the first piezoelectric member 110. The second piezoelectric member 130, for example, includes a second bottom face 131 and a second sidewall 133. The second bottom face 131 has a similar shape, although smaller, to that of the first bottom face 111. Thus, the second bottom face 131 in the illustrated embodiment has a ring shape, and has a substantially same center as that of the first bottom face 111. The second piezoelectric member 130 may be arranged concentrically within the first piezoelectric member 110, and therefore the first and second piezoelectric members 110, 130 may share the same longitudinal axis. The second bottom face 131 may be substantially coplanar with the first bottom face 111. The second sidewall 133 is extended from the second bottom face 131, and makes contact with the inner surface of the first sidewall 113. The second piezoelectric member 130 also includes a second top face 132 that may have the same shape as the second bottom face 131. The second top face 132 may be substantially parallel to the second bottom face 131, and the second sidewall 133 may extend from the second top face 132 in a direction substantially perpendicular to the second top face 132.

When a driving voltage externally provided is applied to the first piezoelectric member 110 and the second piezoelectric member 130, the first piezoelectric member 110 and the second piezoelectric member 130 change a shape thereof, such as by expanding or contracting. The first piezoelectric member 110 and second piezoelectric member 130, for example, serve as a pump that pressurizes ink jetted from an ink jet printer head through a nozzle, as will be further described below.

The first piezoelectric member 110 and the second piezoelectric member 130, for example, correspond to a vibrator. A piezoelectric material is heated to form the vibrator having a tubular shape as described above. Examples of the piezoelectric material include quartz, tourmaline, Rochelle salt, etc. Recently, artificial crystals such as barium titanate, diammonium hydrogen phosphate, ethylene diamine tartaric acid, etc. have also been used as the piezoelectric material.

Figure 2:
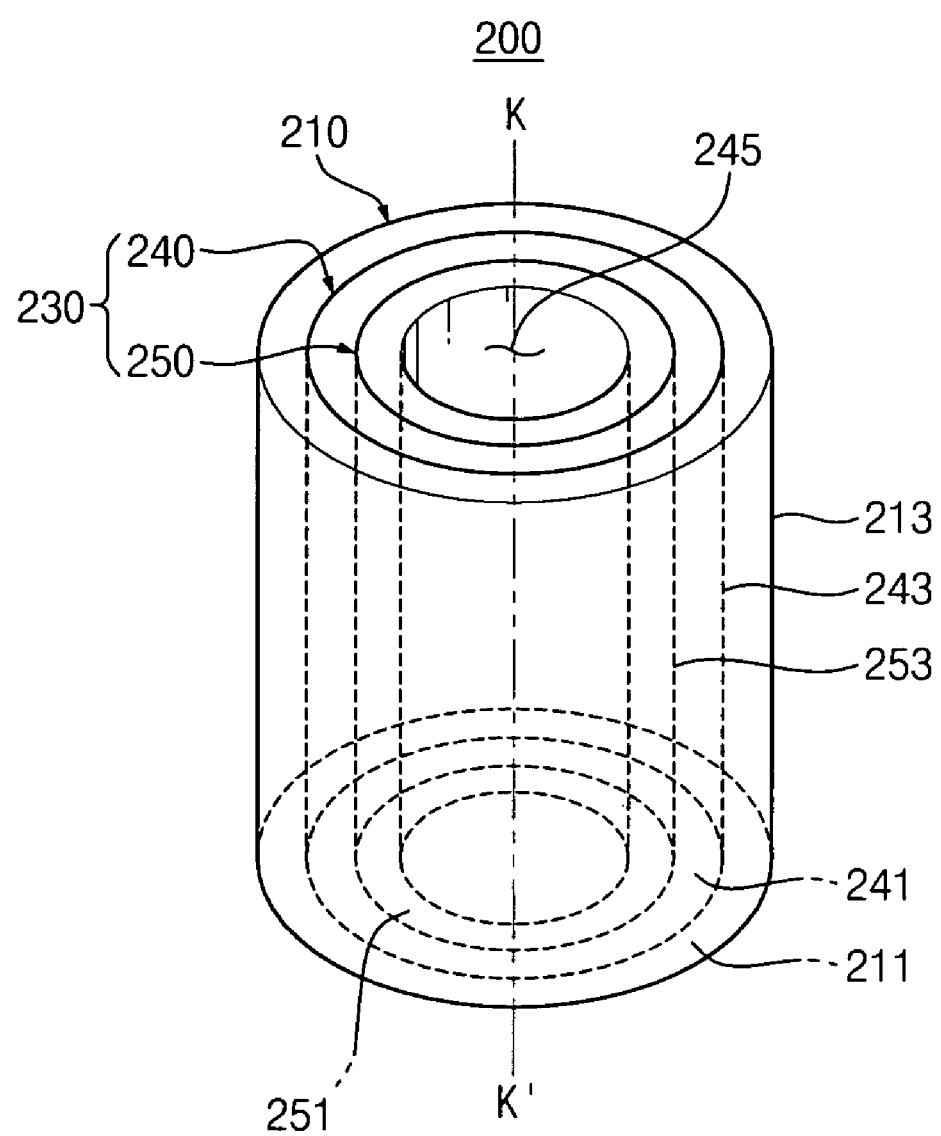
FIG. 2 is a perspective view illustrating another exemplary embodiment of a piezoelectric unit according to the present invention.

FIG. 2 is a perspective view illustrating another exemplary embodiment of a piezoelectric unit according to the present invention.

Referring to FIG. 2, a piezoelectric unit 200 includes a first piezoelectric member 210 and a second piezoelectric member 230.

The piezoelectric unit 200 is substantially identical to the piezoelectric unit 100 shown in FIG. 1A except that the second piezoelectric member 230 includes a plurality of sub piezoelectric members.

The first piezoelectric member 210 has a first opening formed in a first direction k-k', so that the first piezoelectric member 210 has a tubular shape. The first piezoelectric member 210 includes a first bottom face 211 and a first sidewall 213. The first bottom face 211, for example, has a ring shape, which may be circular as illustrated or alternatively polygonal. The first sidewall 213 is extended from the first bottom face 211 in a direction substantially perpendicular to the first bottom face 211, so that an inner surface of the first sidewall 213 defines the first opening.

The second piezoelectric member 230 includes, for example, a first sub piezoelectric member 240 and a second sub piezoelectric member 250. The second piezoelectric member 230 is inserted into the first opening of the first piezoelectric member 210. Thus the second piezoelectric member 230 is nested within the first piezoelectric member 210.

The first sub piezoelectric member 240 has a second opening 245 formed in the first direction k-k', so that the first sub piezoelectric member 240 has a tubular shape. The first sub piezoelectric member 240 includes a second bottom face 241 having a ring shape and a second sidewall 243. The second bottom face 241 may be substantially coplanar with the first bottom face 211. The second sidewall 243 is extended from the second bottom face 241 in a direction substantially perpendicular to the second bottom face 241, so that an inner surface of the second sidewall 243 defines the second opening 245. The first sub piezoelectric member 240 may be arranged concentrically within the first piezoelectric member 210, and therefore the first sub piezoelectric member 240 and the first piezoelectric member 210 may share the same longitudinal axis extending in the first direction k-k'.

The second sub piezoelectric member 250 is inserted into the second opening 245. Therefore the second sub piezoelectric member 250 is nested within the first sub piezoelectric member 240. The second sub piezoelectric member 250, for example, includes a third bottom face 251 and a third sidewall 253. The third bottom face 251 has a similar shape, although smaller, to that of the second bottom face 241. Thus, the third bottom face 251 has a ring shape, and has a substantially same center as that of the second bottom face 241. The second sub piezoelectric member 250 may be arranged concentrically within the first sub piezoelectric member 240, and therefore the second sub piezoelectric member 250 and the first sub piezoelectric member 240 may share the same longitudinal axis extending in the first direction k-k'. The third sidewall 253 is extended from the third bottom face 251, and makes contact with the inner surface of the second sidewall 243.

While two sub piezoelectric members 240, 250 within the second piezoelectric member 230 have been described and illustrated, it would be within the scope of these embodiments to provide more than two sub piezoelectric members within the second piezoelectric member 230.

Figure 3:
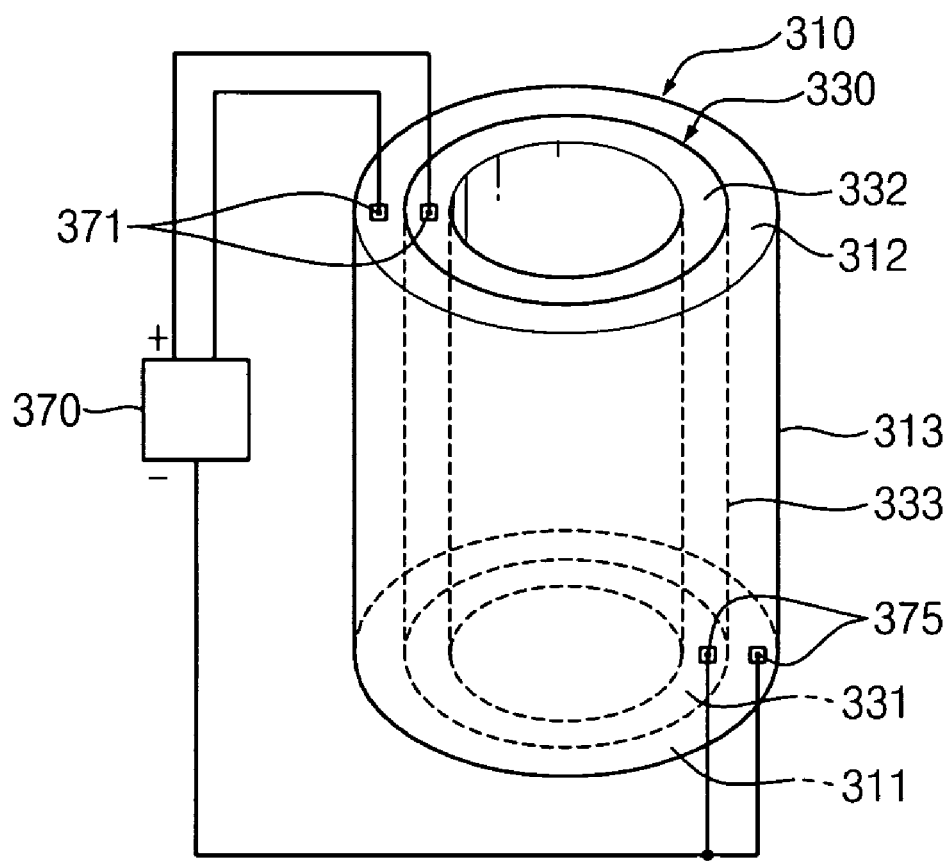
FIG. 3 is a perspective view illustrating still another exemplary embodiment of a piezoelectric unit according to the present invention.

FIG. 3 is a perspective view illustrating still another exemplary embodiment of a piezoelectric unit according to the present invention.

Referring to FIG. 3, a piezoelectric unit 300 includes a first piezoelectric member 310, a second piezoelectric member 330, and a voltage applying member 370. The piezoelectric unit 300 is substantially identical to the piezoelectric unit 100 shown in FIG. 1A except for further including the voltage applying member 370.

The first piezoelectric member 310 includes a first opening formed in a first direction, so that the first piezoelectric member 310 has a tubular shape. The first piezoelectric member 310 includes a first bottom face 311 and a first sidewall 313. The first bottom face 311, for example, has a ring shape, which may be circular as illustrated or alternatively polygonal. The first sidewall 313 is extended from the first bottom face 311 in a direction substantially perpendicular to the first bottom face 311, so that an inner surface of the first sidewall 313 defines the first opening. The first piezoelectric member 310 also includes a first top face 312 that may have the same shape as the first bottom face 311. The first top face 312 may be substantially parallel to the first bottom face 311, and the first sidewall 313 may extend from the first top face 312 in a direction substantially perpendicular to the first top face 312.

The second piezoelectric member 330 is inserted into the first opening. Thus, the second piezoelectric member 330 is nested within the first piezoelectric member 310. The second piezoelectric member 330, for example, includes a second bottom face 331 and a second sidewall 333. The second bottom face 331 has a similar shape, although smaller, to that of the first bottom face 311. Thus, the second bottom face 331 in the illustrated embodiment has a ring shape, and has a substantially same center as that of the first bottom face 311. The second piezoelectric member 330 may be arranged concentrically within the first piezoelectric member 310, and therefore the first and second piezoelectric members 310, 330 may share the same longitudinal axis. The second bottom face 331 may be substantially coplanar with the first bottom face 311. The second sidewall 333 is extended from the second bottom face 331, and makes contact with the inner surface of the first sidewall 313. The second piezoelectric member 330 also includes a second top face 332 that may have the same shape as the second bottom face 331. The second top face 332 may be substantially parallel to the second bottom face 331, and the second sidewall 333 may extend from the second top face 332 in a direction substantially perpendicular to the second top face 332.

The first piezoelectric member 310 and the second piezoelectric member 330 have a predetermined crystal, including, for example, the piezoelectric materials described above with respect to the piezoelectric unit 100. When an external force is applied to the crystal to transform the crystal, electric charges are generated on a surface of the crystal. In contrast, when a voltage externally provided is applied to the crystal, the crystal is transformed, which may cause the piezoelectric members to expand or contract. The voltage applying member 370 is electrically connected to the first piezoelectric member 310 and the second piezoelectric member 330 to apply the driving voltage.

In order to apply the driving voltage, the voltage applying member 370 may include a first electrode 371 and a second electrode 375. The first electrode 371 and the second electrode 375 may be electrically connected to various positions of the first piezoelectric member 310 and the second piezoelectric member 330.

For example, the second electrode 375 is electrically connected to the first bottom face 311 of the first piezoelectric member 310 and the second bottom face 331 of the second piezoelectric member 330. In addition, for example, the first electrode 371 is electrically connected to the first top face 312 of the first piezoelectric member 310, which faces the first bottom face 311, and is electrically connected to the second top face 332 of the second piezoelectric member 330, which faces the second bottom face 331.

The driving voltage is applied to the first piezoelectric member 310 and the second piezoelectric member 330 through the first electrode 371, and a common voltage is applied to the first piezoelectric member 310 and the second piezoelectric member 330 through the second electrode 375. The common voltage has a different polarity from a polarity of the driving voltage. Thus, the first piezoelectric member 310 and the second piezoelectric member 330 may expand or contract.

Printer Head

Figure 4:
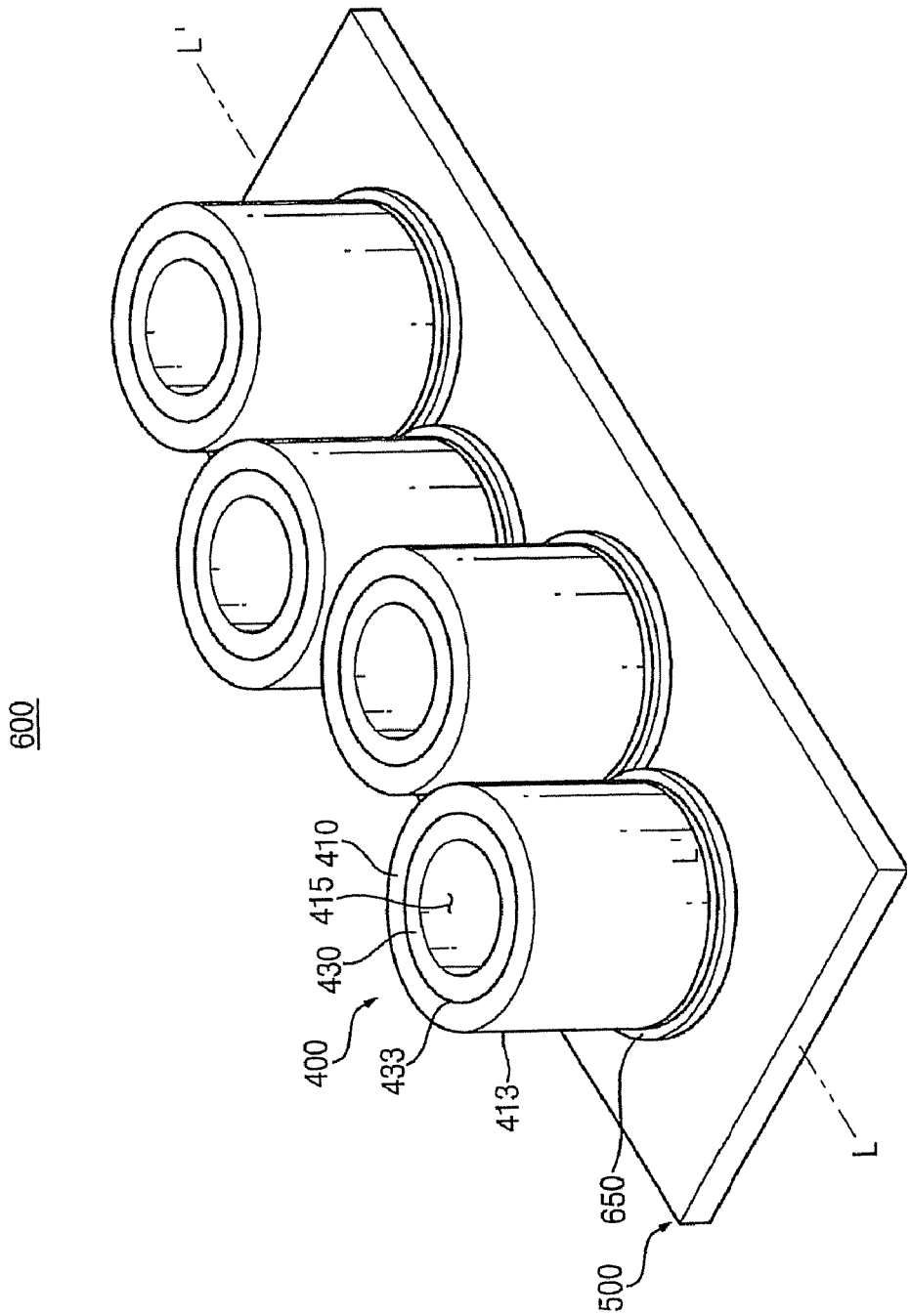
FIG. 4 is a perspective view illustrating an exemplary embodiment of a printer head according to the present invention.

FIG. 4 is a perspective view illustrating an exemplary embodiment of a printer head according to the present invention.

Referring to FIG. 4, a printer head 600 includes a plurality of piezoelectric units 400, an orifice plate 500, and a plurality of elastic members 650.

The piezoelectric units 400 are disposed on the orifice plate 500. Each of the piezoelectric units 400 includes a first piezoelectric member 410, a second piezoelectric member 430, and a voltage applying member (shown in FIG. 8).

The first piezoelectric member 410 has a first opening 415 formed in a first direction, such as along a longitudinal axis of the first piezoelectric member 410, so that the first piezoelectric member 410 has a tubular shape. The first piezoelectric member 410 includes a first bottom face 411 (shown in FIG. 8) and a first sidewall 413. The first bottom face 411, for example, has a ring shape. The first sidewall 413 is extended from the first bottom face 411 in a direction substantially perpendicular to the first bottom face 411, so that an inner surface of the first sidewall 413 defines the first opening 415.

The second piezoelectric member 430 is inserted into the first opening 415. Thus, the second piezoelectric member 430 is nested within the first piezoelectric member 410. The second piezoelectric member 430, for example, includes a second bottom face 431 and a second sidewall 433. The second bottom face 431 has a similar shape, although smaller, to that of the first bottom face 411. Thus, the second bottom face 431 has a ring shape, and has a substantially same center as that of the first bottom face 411. In other words, the second piezoelectric member 430 may be concentrically arranged within the first piezoelectric member 410, and the first and second piezoelectric members 410, 430 may share the same longitudinal axis. The second sidewall 433 is extended from the second bottom face 431 of the second piezoelectric member 430, and makes contact with the inner surface of the first sidewall 413 of the first piezoelectric member 410.

The voltage applying member applies a driving voltage to the first piezoelectric member 410 and the second piezoelectric member 430 to change a shape of each of the first piezoelectric member 410 and the second piezoelectric member 430. The voltage applying member will be further described below.

While a particular embodiment of the piezoelectric units 400 has been described herein, the printer head 600 may instead incorporate any of the previously described piezoelectric units 100, 200, 300 and alternatives thereof.

Figure 5:
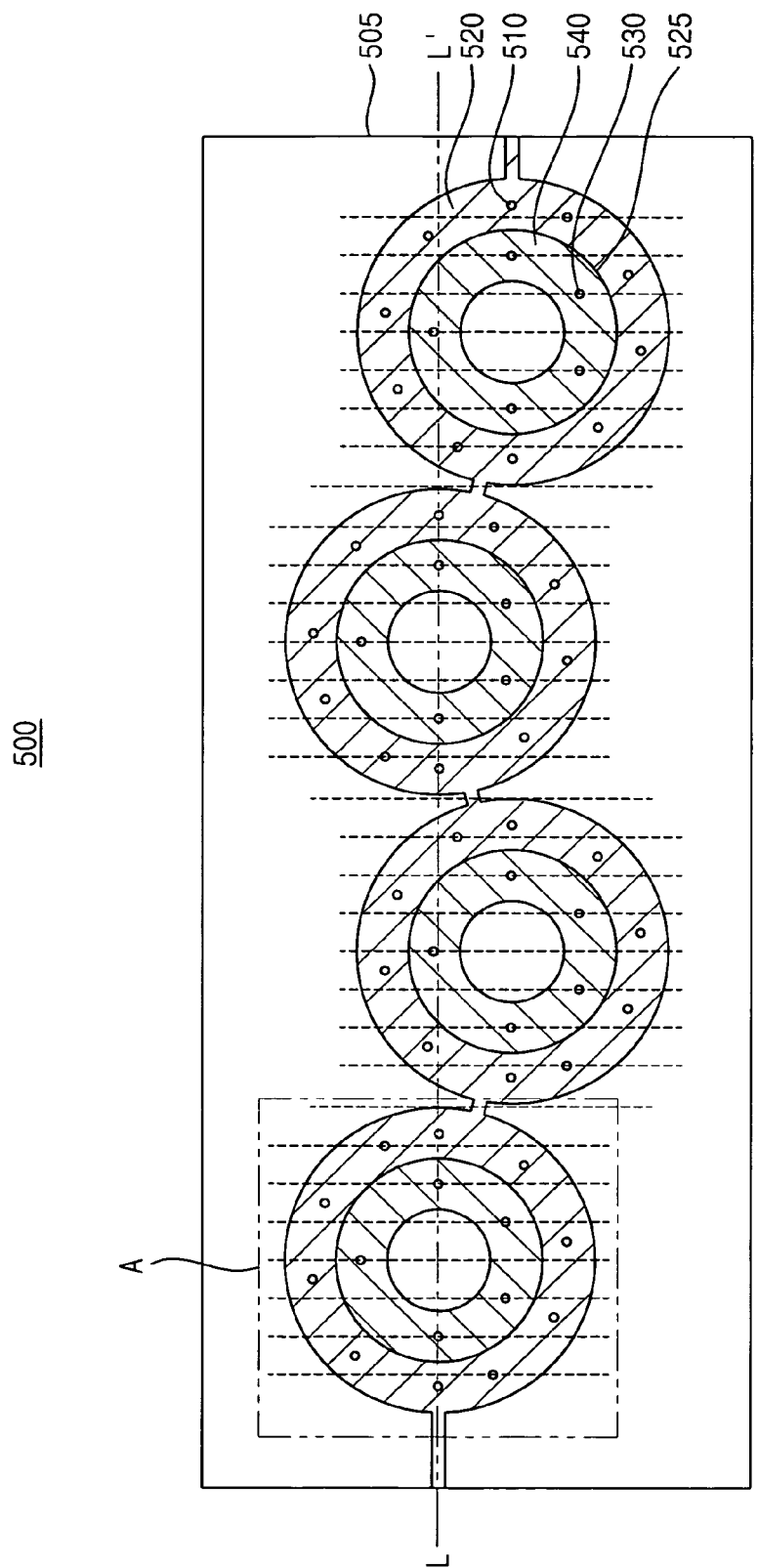
FIG. 5 is a plan view illustrating an exemplary orifice plate in FIG. 4.
Figure 6:
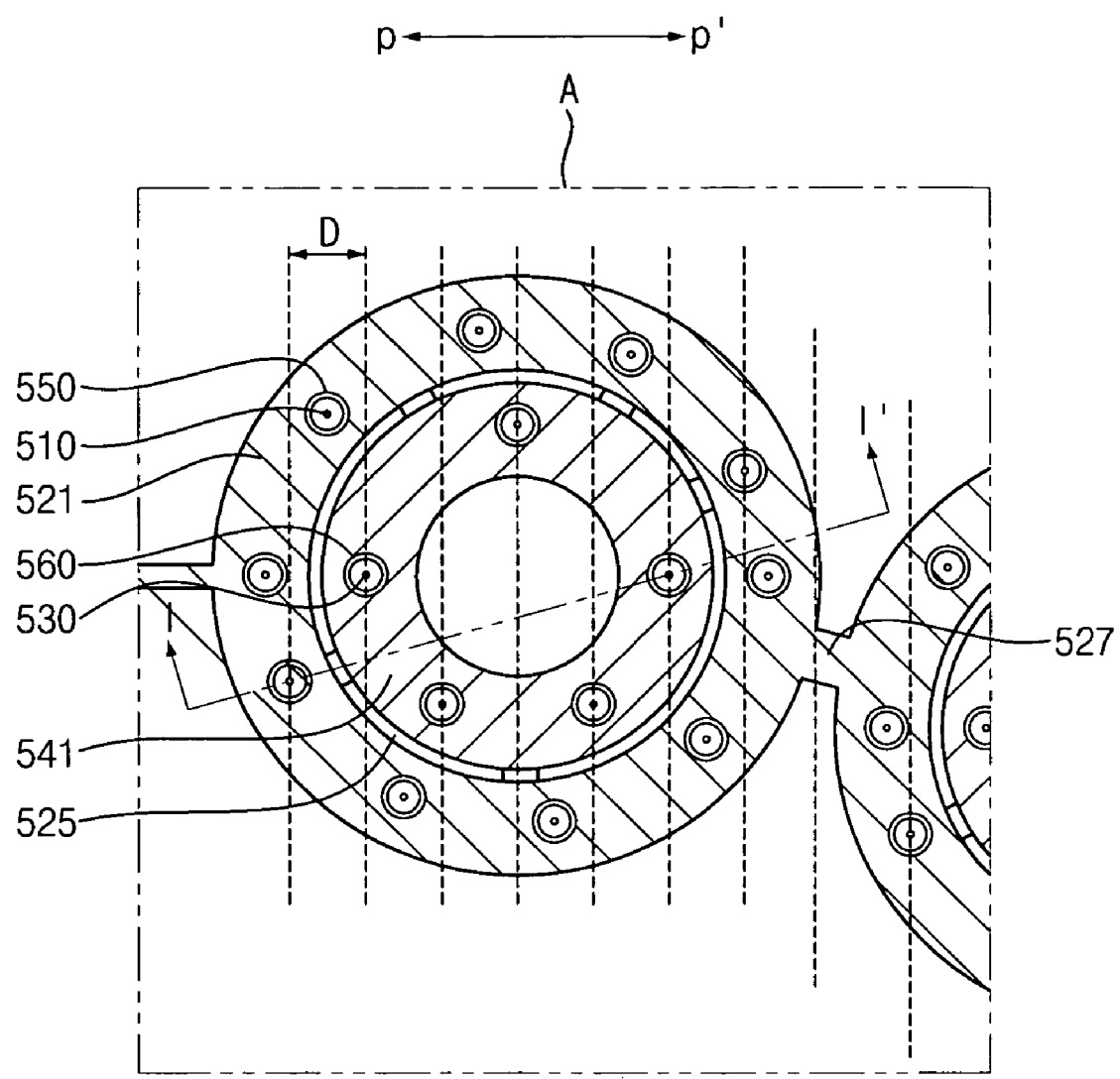
FIG. 6 is an enlarged view illustrating portion 'A' in FIG. 5.

FIG. 5 is a plan view illustrating an exemplary orifice plate in FIG. 4. FIG. 6 is an enlarged view illustrating portion 'A' in FIG. 5.

Referring to FIGS. 5 and 6, the orifice plate 500 includes a body 505 through which first nozzle openings 510 and second nozzle openings 530 are formed, as will be further described below. The body 505 has a plate shape. The body 505 includes an upper face and a lower face facing the upper face.

A first ink providing groove 520 and a second ink providing groove 540 are further formed on the upper face of the body 505. The first and second ink providing grooves 520, 540 are shaped indentations within the upper face of the body 505. The first ink providing groove 520 and the second ink providing groove 540 receive ink externally provided and thus provide the ink into the first nozzle openings 510 and the second nozzle openings 530, respectively.

The first ink providing groove 520 is formed on a first portion of the upper face of the body 505, the first portion facing the first bottom face 411 of the first piezoelectric member 410. The second ink providing groove 540 is formed on a second portion of the upper face of the body 505, the second portion facing the second bottom face 431 of the second piezoelectric member 430. Thus, each of the first and second ink providing grooves 520 and 540 has a substantially circular shape, and the first and second ink providing grooves 520 and 540 have a substantially same center. The number of first and second ink providing grooves 520, 540 thus corresponds to the number of first and second piezoelectric members 510, 430 provided on the printer head 600.

The first ink providing groove 520 and the second ink providing groove 540 are isolated from each other by a boundary wall 525. A first connecting groove is formed at a predetermined position of an upper face of the boundary wall 525. The ink, which is provided into the first ink providing groove 520, flows into the second ink providing groove 540 through the first connecting groove.

For example, a plurality of the first ink providing grooves 520 is formed on the upper face of the body 505. The first ink providing grooves 520 are arranged in a zigzag shape along a second direction L-L'. By example only, a first alternating set of first ink providing grooves may be aligned with each other, while a second alternating set of first ink providing grooves may be aligned with each other, but offset from the first alternating set of first ink providing grooves. Adjacent first ink providing grooves 520 are connected to each other through a second connecting groove 527. Thus, the second connecting groove 527 provides a passage between the first ink providing grooves 520 adjacent to each other, through which the ink may flow.

The first nozzle openings 510 and the second nozzle openings 530 are formed through the body 505, and open through the lower surface of the body 505 for ink deposition. Particularly, the first nozzle openings 510 are arranged on a first bottom portion 521 of the first ink providing groove 520 in a substantially circular shape, and the second nozzle openings 530 are arranged on a second bottom portion 541 of the second ink providing groove 540 in a substantially circular shape. That is, the first and second nozzle openings 510, 530 are spaced and dispersed throughout the first and second ink providing grooves 520, 540, respectively. Thus, an ink receiving end of the first nozzle openings 510 face the first bottom face 411 of the first piezoelectric member 410, and an ink receiving end of the second nozzle openings 530 face the second bottom face 431 of the second piezoelectric member 430.

For example, the first nozzle openings 510 and the second nozzle openings 530 are formed through the body 505 of the orifice plate 500 in order that a first ink drop jetted from an ink depositing end of the first nozzle openings 510 and a second ink drop jetted from an ink depositing end of the second nozzle openings 530 are not overlapped with each other when the printer head 600 moves in a predetermined direction to perform a printing process.

For example, the first nozzle openings 510 and the second nozzle openings 530 are disposed along a direction substantially perpendicular to a normal line with respect to the upper face of the body 505. The first nozzle openings 510 and the second nozzle openings 530 are spaced apart from each other at regular intervals. The direction substantially perpendicular to the normal line, for example, is substantially perpendicular to a direction in which the printer head 600 moves to perform the printing process.

The direction substantially perpendicular to the direction in which the printer head 600 moves is defined as a third direction p-p' shown in FIG. 6. The third direction p-p' is substantially the same as the second direction L-L' shown in FIG. 5. Thus, an interval D/2 among the first nozzle openings 510 and the second nozzle openings 530 with respect to the third direction p-p' is substantially constant. That is, a distance between one nozzle opening 510 or 530 to a most adjacent nozzle opening 510 or 530 in the third direction p-p' is substantially D/2.

The first nozzle openings 510 and the second nozzle openings 530 may be disposed in various shapes or patterns within the first and second ink providing grooves 520, 540, so that the interval D/2 among the first nozzle openings 510 and the second nozzle openings 530 with respect to the third direction p-p' is substantially constant.

The orifice plate 500 may include a first partition wall 550 and a second partition wall 560. The first partition wall 550 surrounds a peripheral portion of each of the first nozzle openings 510. The first partition wall 550 is protruded from the first bottom portion 521, and has a height less than a depth of the first ink providing groove 520. The second partition wall 560 surrounds a peripheral portion of each of the second nozzle openings 530. The second partition wall 560 is protruded from the second bottom portion 541, and has a height less than a depth of the second ink providing groove 540. The first and second partition walls 550, 560 define enclosed areas containing the first and second nozzle openings 510, 530, respectively. Thus, an inside or interior of the first and second partition walls 550, 560 refers to an area within the walls including the first and second nozzle openings 510, 530, and an outside or exterior of the first and second partition walls 550, 560 refers to an area of the first and second ink providing grooves 520, 540 that do not include the first and second nozzle openings 510, 530.

When each of the piezoelectric units 400 jets ink through the first nozzle openings 510 and the second nozzle openings 530, a pressure difference between an inside and an outside, which are defined by each of the first partition wall 550 and the second partition wall 560, may be induced.

Figure 7:
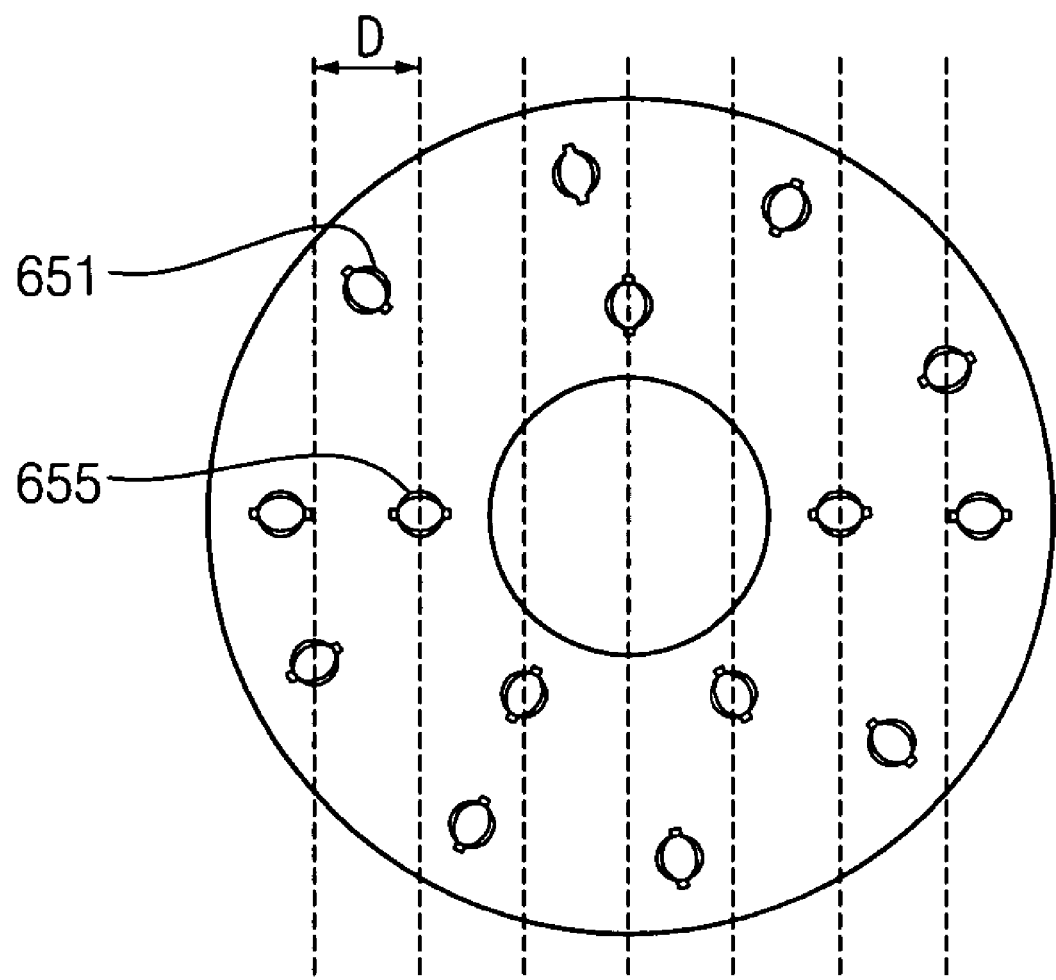
FIG. 7 is a plan view illustrating an exemplary elastic member in FIG. 4.
Figure 8:
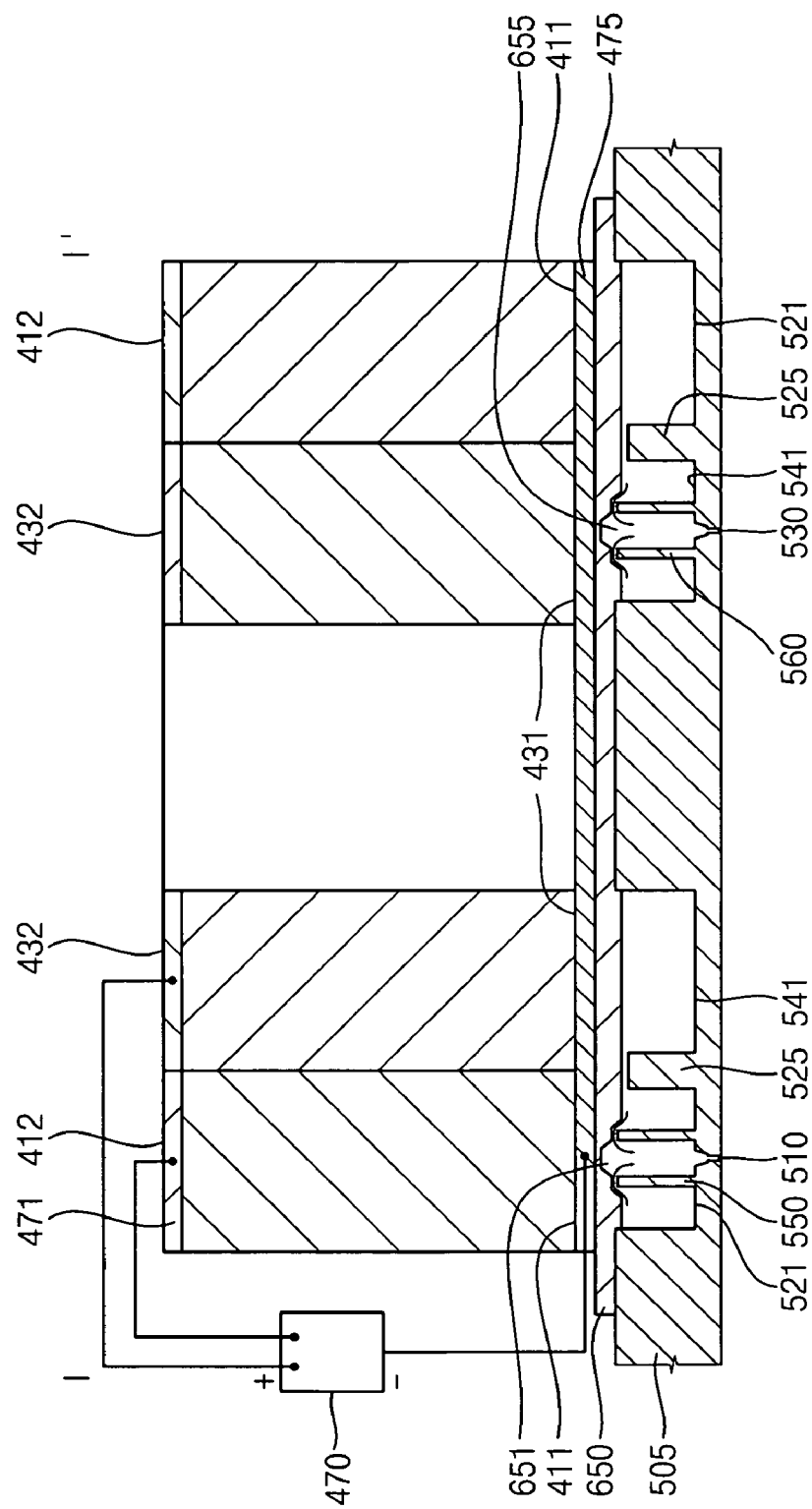
FIG. 8 is a cross-sectional view taken along line I-I' in FIG. 6.

FIG. 7 is a plan view illustrating an exemplary elastic member in FIG. 4. FIG. 8 is a cross-sectional view taken along line I-I' in FIG. 6.

Referring to FIGS. 7 and 8, the elastic member 650 is disposed between each of the piezoelectric units 400 and the orifice plate 500. The elastic member 650 covers the first ink providing grooves 520 and the second ink providing grooves 540, and may have a larger diameter or outer perimeter than the first and second ink providing grooves 520, 540.

The elastic member 650 includes a first face and a second face facing the first face. The elastic member 650 has a plate shape. The first face of the elastic member 650 faces the upper face of the orifice plate 500. A plurality of first flow grooves 651 and a plurality of second flow grooves 655 are formed on the first face of the elastic member 650. The first and second flow grooves 651 and 655 face the first and second nozzle openings 510 and 530, respectively. That is, the number of first and second flow grooves 651, 655 may correspond to the number of first and second nozzle openings 510, 530 and are correspondingly aligned.

The first flow groove 651 is overlapped with the first ink providing groove 520 and the interior of the first partition wall 550. The first face of the elastic member 650 is spaced apart from an upper portion of the first partition wall 550 due to the first flow groove 651. The first flow groove 651 serves as a passage for flowing ink from the first ink providing groove 520 exterior of the first partition wall 550 into the interior of the first partition wall 550.

The second flow groove 655 is overlapped with the second ink providing groove 540 and the interior of the second partition wall 560. The first face of the elastic member 650 is spaced apart from an upper portion of the second partition wall 560 due to the second flow groove 655. The second flow groove 655 serves as a passage for flowing ink from the second ink providing groove 540 exterior of the second partition wall 560 into the interior of the second partition wall 560.

The voltage applying member 470 may include a first electrode 471 and a second electrode 475 to apply the driving voltage and common voltage to the first piezoelectric member 410 and the second piezoelectric member 430.

The first electrode 471 and the second electrode 475 may be electrically connected to various positions of the first piezoelectric member 410 and the second piezoelectric member 430. For example, as illustrated, the second electrode 475 is disposed on the second face of the elastic member 650, and electrically connected to the first bottom face 411 and the second bottom face 431. Also as illustrated, for example, the first electrode 471 is electrically connected to the first top face 412 of the first piezoelectric member 410 and the second top face 432 of the second piezoelectric member 430.

The driving voltage may be applied to the first piezoelectric member 410 and the second piezoelectric member 430 through the first electrode 471, and the common voltage, which has a different polarity from that of the driving voltage, may be applied to the first piezoelectric member 410 and the second piezoelectric member 430 through the second electrode 475.

Accordingly, the first piezoelectric member 410 and the second piezoelectric member 430 may expand or contract. Thus, the elastic member 650 may become convex toward the first nozzle opening 510 and/or the second nozzle opening 530, and may be returned to an original shape. Hence, a volume of the interior of each of the first and second partition walls 550 and 560 is changed to induce the pressure difference between the interior and the exterior of each of the first partition wall 550 and the second partition wall 560.

As a result, ink flows from the exterior into the interior of the first partition wall 550 by hurdling the first partition wall 550 through the first flow groove 651, and ink flows from the exterior into the interior of the second partition wall 560 by hurdling the second partition wall 560 through the second flow groove 655. By hurdling the first and second partition walls 550, 560, it should be understood that the ink passes over the first and second partition walls 550, 560 into the interior spaces formed by the first and second partition walls 550, 560. Then, the ink provided into the interior of each of the first partition wall 550 and second partition wall 560 is jetted outside the orifice plate 500 through each of the ink depositing ends of each of the first nozzle openings 510 and the second nozzle openings 530.

The printer head 600 optionally includes a protective case (not shown) to cover and protect the piezoelectric units 400. The protective case fixes the piezoelectric units 400, such as relative to the orifice plate 500.

Figure 9:
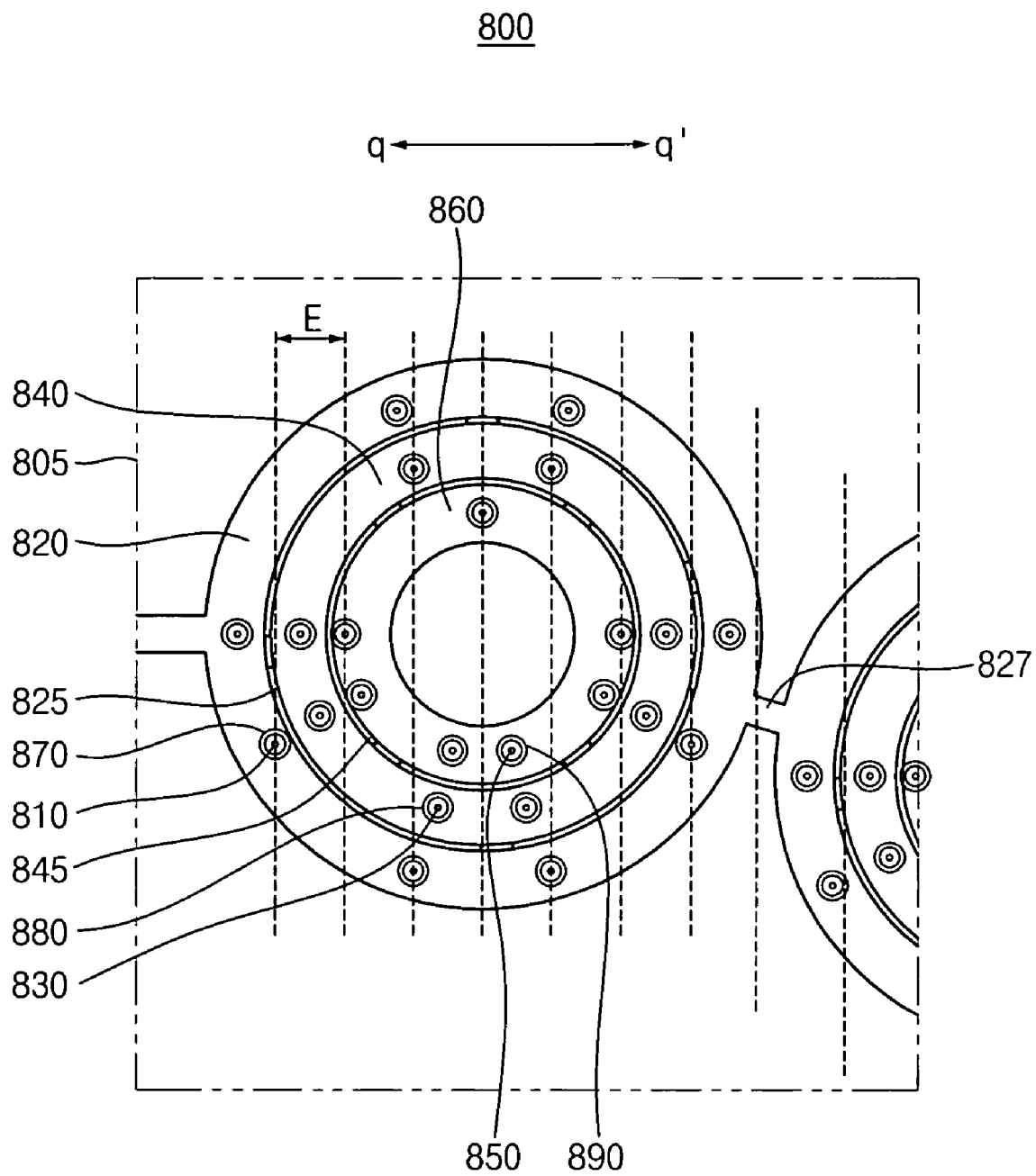
FIG. 9 is a plan view illustrating another exemplary embodiment of an orifice plate of a printer head according to the present invention.

FIG. 9 is a plan view illustrating another exemplary embodiment of an orifice plate of a printer head according to the present invention.

Referring to FIG. 9, the printer head includes a plurality of piezoelectric units (not shown), an orifice plate 800, and a plurality of elastic members (not shown).

Each of the piezoelectric units is substantially identical to the piezoelectric unit 200 shown in FIG. 2. Thus, any further description for the piezoelectric units 700 will be omitted.

The orifice plate 800 includes a body 805 through which a plurality of first nozzle openings 810, a plurality of second nozzle openings 830, and a plurality of third nozzle openings 850 are formed. The body 805 has a plate shape, and includes an upper face and a lower face facing the upper face. The first, second, and third nozzle openings 810, 830, and 850 will be further described below.

A first ink providing groove 820, a second ink providing groove 840, and a third ink providing groove 860 are formed on the upper face of the body 805. The first, second, and third ink providing grooves 820, 840, and 860 receive ink externally provided and thus provide the ink into the ink receiving ends of the first, second, and third nozzle openings 810, 830, and 850, respectively.

The first, second and third ink providing grooves 820, 840, and 860 are formed on a first portion, a second portion, and a third portion of the upper face of the body 505, respectively. The first, second, and third portions face a first bottom face (not shown) of a first piezoelectric member (not shown), a second bottom face (not shown) of a second piezoelectric member (not shown), and a third bottom face (not shown) of a third piezoelectric member (not shown), respectively. Thus, each of the first, second, and third ink providing grooves 820, 840, and 860 has a substantially circular shape, and the first, second and third ink providing grooves 820, 840, and 860 have a substantially same center, therefore they may be concentrically arranged with respect to each other.

The first ink providing groove 820 and the second ink providing groove 840 are isolated from each other by a first boundary wall 825, and the second ink providing groove 840 and the third ink providing groove 860 are isolated from each other by a second boundary wall 845.

A first connecting groove is formed at a predetermined position of an upper face of the first boundary wall 825, and a second connecting groove is formed at a predetermined position of an upper face of the second boundary wall 845. The ink, which is provided into the first ink providing groove 820, flows into the second ink providing groove 840 through the first connecting groove. Then the ink, which is provided into the second ink providing groove 840 from the first ink providing groove 820, flows into the third ink providing groove 860 through the second connecting groove.

For example, a plurality of the first ink providing grooves 820 is formed on the upper face of the body 805. The first ink providing grooves 820 are arranged in a zigzag shape along a second direction L-L' as in the prior embodiment. Adjacent first ink providing grooves 820 are connected to each other through a third connecting groove 827. Thus, the third connecting groove 827 provides a passage between the first ink providing grooves 820 adjacent to each other, through which the ink may flow.

The first nozzle openings 810, the second nozzle openings 830, and the third nozzle openings 850 are formed through the body 805. Particularly, the first nozzle openings 810 are arranged on a first bottom portion of the first ink providing groove 820s in a substantially circular shape, the second nozzle openings 830 are arranged on a second bottom portion of the second ink providing grooves 840 in a substantially circular shape, and the third nozzle openings 850 are arranged on a third bottom portion of the third ink providing grooves 860 in a substantially circular shape. That is, the first, second, and third nozzle openings 810, 830, 850 are spaced and dispersed throughout the first, second, and third ink providing grooves 820, 840, 860 respectively.

Thus, ink receiving ends of the first nozzle openings 810 face the first bottom face of the first piezoelectric member, ink receiving ends of the second nozzle openings 830 face the second bottom face of the second piezoelectric member, and ink receiving ends of the third nozzle openings 850 face the third bottom face of the third piezoelectric member.

For example, the first nozzle openings 810, the second nozzle openings 830 and the third nozzle openings 850 are formed through the body 805 of the orifice plate 800 in order that a first ink drop jetted from ink depositing ends of the first nozzle openings 810, a second ink drop jetted from ink depositing ends of the second nozzle openings 830, and a third ink drop jetted from ink depositing ends of the third nozzle openings 850 are not overlapped with each other when the printer head moves in a predetermined direction to perform a printing process.

For example, the first, second, and third nozzle openings 810, 830, and 850 are disposed along a direction substantially perpendicular to a normal line with respect to the upper face of the body 805. The first, second and third nozzle openings 810, 830 and 850 are spaced apart from each other at regular intervals. The direction substantially perpendicular to the normal line, for example, is substantially perpendicular to a direction in which the printer head moves to perform the printing process.

The direction substantially perpendicular to the direction in which the printer head moves is defined as a third direction q-q' shown in FIG. 9. The third direction q-q' is substantially the same as the second direction L-L' shown in FIG. 5. Thus, an interval E/3 among the first, second, and third nozzle openings 810, 830, and 850 with respect to the third direction q-q' is substantially constant. That is, a distance between one nozzle opening 810, 830, or 850 to a most adjacent nozzle opening 810, 830, or 850 in the third direction q-q' is substantially E/3.

The first, second, and third nozzle openings 810, 830, and 850 may be disposed in various shapes or patterns so that the interval E/3 among the first, second, and third nozzle openings 810, 830, and 850 with respect to the third direction q-q' is substantially constant.

The orifice plate 800 may further include a first partition wall 870, a second partition wall 880, and a third partition wall 890. The first partition wall 870 surrounds a peripheral portion of each of the first nozzle openings 810. The first partition wall 870 is protruded from the first bottom portion of the first ink providing groove 820, and has a height less than a depth of the first ink providing groove 820. The second partition wall 880 surrounds a peripheral portion of each of the second nozzle openings 830. The second partition wall 880 is protruded from the second bottom portion of the second ink providing groove 840, and has a height less than a depth of the second ink providing groove 840. The third partition wall 890 surrounds a peripheral portion of each of the third nozzle openings 850. The third partition wall 890 is protruded from the third bottom portion of the third ink providing groove 860, and has a height less than a depth of the third ink providing groove 860.

When each of the piezoelectric units jets ink through the first, second, and third nozzle openings 810, 830, and 850, a pressure difference between an interior and an exterior of each of the first, second, and third partition walls 870, 880, and 890, may be induced.

The elastic member is disposed between each of the piezoelectric units and the orifice plate 800. The elastic member is changed in accordance with a changed shape of each of the piezoelectric units, so that ink may be jetted through the first, second, and third nozzle openings 810, 830, and 850.

According to the present invention, a piezoelectric unit has a tubular shape, so that a plurality of nozzle openings corresponds to one piezoelectric unit.

In addition, a piezoelectric unit of a printer head includes piezoelectric members each of which has a tubular shape. Thus, nozzle openings formed through an orifice plate are arranged in a circular shape along a ring shape of each of the piezoelectric members. As a result, an interval between nozzle openings along a direction may be reduced, so that a resolution of the printer head may be enhanced.

Moreover, a number of the piezoelectric members with respect to a number of the nozzle openings is reduced. Thus, a lifetime of the piezoelectric member and a lifetime of a printer head having the piezoelectric member may be improved.

Furthermore, ink drops jetted from the nozzle openings have a reduced pitch, so that a layer generated from the ink drops may have a uniform thickness.

Although the example embodiments of the present invention have been described, it is understood that the present invention should not be limited to these exemplary embodiments but various changes and modifications can be made by one ordinary skilled in the art within the spirit and scope of the present invention as hereinafter claimed. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A printer head comprising:
 a piezoelectric unit including a first piezoelectric member having a first opening formed in a first direction, the first piezoelectric member having a tubular shape and a first bottom face; and
 an orifice plate including a plurality of first nozzle openings facing the first piezoelectric member, the plurality of first nozzle openings being arranged in a substantially circular shape.

2. The printer head of claim 1, wherein
 the piezoelectric unit further includes a second piezoelectric member inserted into the first opening, the second piezoelectric member having a tubular shape and a second bottom face, and
 the orifice plate further includes a plurality of second nozzle openings facing the second piezoelectric member, the plurality of second nozzle openings being arranged in a substantially circular shape.

3. The printer head of claim 2, wherein the second piezoelectric member is arranged concentrically within the first piezoelectric member.

4. The printer head of claim 2, wherein an inner surface of a sidewall of the first piezoelectric member contacts an outer surface of a sidewall of the second piezoelectric member.

5. The printer head of claim 2, wherein the second piezoelectric member comprises at least two sub piezoelectric members each having a tubular shape, a smaller one of the sub piezoelectric members inserted into an opening of a larger one of the sub piezoelectric members, the opening of the larger one of the sub piezoelectric members formed in the first direction.

6. The printer head of claim 5, wherein the first piezoelectric member and the at least two sub piezoelectric members share a same longitudinal axis.

7. The printer head of claim 2, further comprising a voltage applying member electrically connected to the first and second piezoelectric members, the voltage applying member applying the driving voltage to the first and second piezoelectric members.

8. The printer head of claim 7, wherein the voltage applying member comprises:
 a first electrode applying the driving voltage to the first and second piezoelectric members; and
 a second electrode applying a common voltage to the first and second piezoelectric members, the common voltage having a different voltage than a voltage of the driving voltage.

9. The printer head of claim 8, wherein the first electrode is connected to a top face of each of the first and second piezoelectric members, and the second electrode is connected to a bottom face of each of the first and second piezoelectric members.

10. A printer head comprising:
 a piezoelectric unit comprising:
  a first piezoelectric member having a first opening formed in a first direction, the first piezoelectric member having a tubular shape;
  a second piezoelectric member inserted into the first opening; and
  a voltage applying member applying a driving voltage to the first and second piezoelectric members, the driving voltage changing a shape of each of the first and second piezoelectric members;
 an orifice plate comprising a body, and having a plurality of first nozzle openings, an ink receiving end of each of the plurality of first nozzle openings facing the first piezoelectric member, and a plurality of second nozzle openings, an ink receiving end of each of the plurality of second nozzle openings facing the second piezoelectric member, the first and second nozzle openings formed through the body; and an elastic member disposed between the ink receiving ends of the first and second nozzle openings and the first and second piezoelectric members, a shape of the elastic member changed in accordance with a changed shape of each of the first and second piezoelectric members upon application of the driving voltage, a changed shape of the elastic member resulting in ink jetting through ink depositing ends of each of the first and second nozzle openings.

11. The printer head of claim 10, wherein the first nozzle openings and the second nozzle openings are disposed along a direction substantially perpendicular with respect to a normal line of a surface of the body, and spaced apart form each other at regular intervals.

12. The printer head of claim 10, wherein the first piezoelectric member comprises:

a first bottom face having a ring shape; and a first sidewall extended from the first bottom face.

13. The printer head of claim 12, wherein the second piezoelectric member comprises:

a second bottom face having a substantially same center as a center of the first bottom face; and a second sidewall extended from the second bottom face and inserted into the first opening.

14. The printer head of claim 13, wherein the piezoelectric unit further comprises a third piezoelectric member having:

a third bottom face having a substantially same center as the center of the second bottom face; and a third sidewall extended from the third bottom face and inserted into a second opening defined by an inner surface of the second sidewall.

15. The printer head of claim 14, wherein the orifice plate has a plurality of third nozzle openings, an ink receiving end of each of the plurality of third nozzle openings facing the third piezoelectric member, the third nozzle openings formed through the body.

16. The printer head of claim 14, wherein the orifice plate has:

a first ink providing groove formed on a surface of the body, the first ink providing groove having a ring shape and facing the first bottom face; and a second ink providing groove facing the second bottom face.

17. The printer head of claim 16, wherein the first nozzle openings are arranged in a ring shape on a first bottom portion of the first ink providing groove, and the second nozzle openings are arranged in a ring shape on a second bottom portion of the second ink providing groove.

18. The printer head of claim 17, wherein the orifice plate further comprises:

a first partition wall protruded from the first bottom portion and surrounding a peripheral portion of each of the first nozzle openings; and a second partition wall protruded from the second bottom portion and surrounding a peripheral portion of each of the second nozzle openings.

19. The printer head of claim 18, wherein the elastic member has a first flow groove through which ink flows into an area enclosed by the first partition wall by passing over the first partition wall, and a second flow groove through which ink flows into an area enclosed by the second partition wall by passing over the second partition wall.

20. The printer head of claim 19, wherein the elastic member includes a plurality of first flow grooves and a plurality of second flow grooves, each first flow groove aligned with a respective first nozzle opening and each second flow groove aligned with a respective second nozzle opening.

21. The printer head of claim 16, further comprising a plurality of the piezoelectric units, wherein first ink providing grooves of the piezoelectric units are arranged in a second direction upon a surface of the body of the orifice plate, the second direction different from the first direction.

* * * * *